United States Patent
Sakaguchi

(10) Patent No.: US 10,824,181 B2
(45) Date of Patent: Nov. 3, 2020

(54) REFERENCE VOLTAGE CIRCUIT AND SEMICONDUCTOR DEVICE

(71) Applicant: ABLIC Inc., Chiba-shi, Chiba (JP)

(72) Inventor: Kaoru Sakaguchi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/752,929

(22) Filed: Jan. 27, 2020

(65) Prior Publication Data

US 2020/0257325 A1    Aug. 13, 2020

(30) Foreign Application Priority Data

Feb. 8, 2019 (JP) .................................. 2019-021108

(51) Int. Cl.
*G05F 3/02* (2006.01)
*G05F 3/24* (2006.01)
*H01L 27/088* (2006.01)

(52) U.S. Cl.
CPC ............ *G05F 3/24* (2013.01); *H01L 27/0883* (2013.01)

(58) Field of Classification Search
CPC ... G05F 1/465; G05F 3/24; G05F 3/30; G05F 3/205; G05F 3/242; G05F 3/247; G05F 3/262; G05F 3/265; G11C 5/147; H01L 27/0883
See application file for complete search history.

(56) References Cited

U.S. PATENT DOCUMENTS

| 2010/0207686 A1* | 8/2010 | Lai ............................ G05F 3/30 327/541 |
| 2011/0050197 A1* | 3/2011 | Yuasa ..................... G05F 3/242 323/313 |
| 2015/0212536 A1 | 7/2015 | Sugiura et al. |

FOREIGN PATENT DOCUMENTS

JP        2015-141462 A    8/2015

* cited by examiner

*Primary Examiner* — Long Nguyen
(74) *Attorney, Agent, or Firm* — Brinks Gilson & Lione

(57) ABSTRACT

A reference voltage circuit includes a first MOS transistor pair having a first MOS transistor of an enhancement type having a gate and a drain connected to each other, and a second MOS transistor of a depletion type having a gate connected to a source of the first MOS transistor, a source connected to the drain of the first MOS transistor, and a drain connected to an output terminal; and a second MOS transistor pair having a third MOS transistor of an enhancement type having a gate and a drain connected to the output terminal and a source connected to the source of the second MOS transistor, and a fourth MOS transistor of a depletion type having a gate connected to the source of the third MOS transistor and a source connected to the output terminal. All the MOS transistors operate in a weak inversion region.

10 Claims, 5 Drawing Sheets

REFERENCE VOLTAGE CIRCUIT AND SEMICONDUCTOR DEVICE

RELATED APPLICATIONS

This application claims priority to Japanese Patent Application No. 2019-021108 filed on Feb. 8, 2019, the entire content of which is incorporated herein by reference.

BACKGROUND OF E INVENTION

1. Field of the Invention

The present invention relates to a reference voltage circuit and a semiconductor device.

2. Description of the Related Art

Conventionally, a reference voltage circuit that determines an output voltage from the sum of the absolute values of the threshold voltages of an enhancement type MOS transistor and a depletion type MOS transistor has been used in a semiconductor device.

It is known that the temperature dependence of a reference voltage as the output of such a reference voltage circuit reduces because the temperature dependences of respective threshold voltages of the enhancement type MOS transistor and the depletion type MOS transistor cancel out. Also, an arbitrarily high reference voltage can be obtained by increasing the number of either the depletion type MOS transistors or the enhancement type MOS transistors (for example, see FIG. 2 to FIG. 4 in Japanese Patent Application Laid-open No. 2015-141462).

SUMMARY OF THE INVENTION

However, in the reference voltage circuit disclosed in Japanese Patent Application Laid-open No. 2015-141462, two or more constant current sources are provided to bias the enhancement type MOS transistor and the depletion type MOS transistor. Since current always flows in two or more paths, it is difficult to reduce the current consumption.

It is an object of the present invention to provide a reference voltage circuit capable of arbitrarily setting a high reference voltage while making the current consumption minute.

A reference voltage circuit according to an embodiment of the present invention includes a first MOS transistor pair, a second MOS transistor pair, and an output terminal. The first MOS transistor pair includes a first MOS transistor of a first-conductivity enhancement type having a gate and a drain connected to each other, and a second MOS transistor of a first-conductivity depletion type having a gate connected to a source of the first MOS transistor, a source connected to the drain of the first MOS transistor, and a drain connected to the output terminal. The second MOS transistor pair includes a third MOS transistor of a first-conductivity enhancement type having a gate and a drain connected to the output terminal and a source connected to the source of the second MOS transistor, and a fourth MOS transistor of a first-conductivity depletion type having a gate connected to the source of the third MOS transistor and a source connected to the output terminal. And all the MOS transistors are configured to operate in a weak inversion region.

According to a reference voltage circuit of the present invention, since current consumption is determined by the current of the first-conductivity enhancement type MOS transistor (first MOS transistor) operating in a weak inversion region, the current consumption can be easily made minute.

DETAILED DESCRIPTION OF THE PREFERRED EMBODIMENTS

An embodiment of the present invention will be described below with reference to the accompanying drawings.

Figure 1:
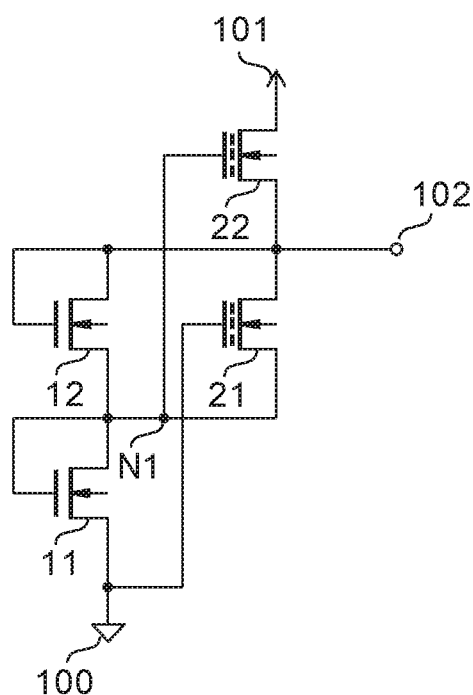
FIG. 1 is a circuit diagram for describing a reference voltage circuit according to an embodiment of the present invention.

FIG. 1 is a circuit diagram for describing a reference voltage circuit according to the embodiment of the present invention.

A reference voltage circuit 10 according to the embodiment includes first-conductivity (N-channel here) enhancement type MOS transistors 11, 12, and first-conductivity depletion type MOS transistors 21, 22. Here, the MOS transistor 11 and the MOS transistor 21 constitute the first MOS transistor pair, and the MOS transistor 12 and the MOS transistor 22 constitute the second MOS transistor pair.

The connections of respective components of the reference voltage circuit 10 will be described.

In the MOS transistor 11, the source is connected to a ground terminal 100, and the gate and the drain are connected to the source of the MOS transistor 12. The gate and the drain of the MOS transistor 12 are connected to an output terminal 102. In the MOS transistor 21, the source is connected to the source of the MOS transistor 12, the gate is connected to the ground terminal 100, and the drain is connected to the output terminal 102. In the MOS transistor 22, the source is connected to the output terminal 102, the gate is connected to the source of the MOS transistor 21, and the drain is connected to a power supply terminal 101. The connection point between the drain of the MOS transistor 11 and the source of the MOS transistor 21 is referred to as a node N1.

The operation of the reference voltage circuit 10 having an above-mentioned structure will be described below.

Fall of the drain voltage of the MOS transistor 11 is limited by the gate-source voltage of the MOS transistor 21. Rise of the source voltage of the MOS transistor 21 is limited by the gate-source voltage of the MOS transistor 11. As a result, the voltage at the node N1 stabilizes at a constant voltage in respect to the ground terminal 100.

The same relationship also holds between the MOS transistor 12 and the MOS transistor 22, and the voltage at the output terminal 102 as the connection point between the drain of the MOS transistor 12 and the source of the MOS transistor 22 stabilizes at a constant voltage in respect to the node N1.

Here, a threshold voltage $V_{TE}$ of each enhancement type MOS transistor is set larger than the absolute value of a threshold voltage $V_{TD}$ of each depletion type MOS transistor.

Setting of such threshold voltages causes all the MOS transistors 11, 12 and the MOS transistors 21, 22 to operate in a weak inversion region. As a result, the voltage at the output terminal 102 stabilizes at the output voltage $V_{out}$ in Equation 1.

$$V_{out}=(V_{TE}-V_{TD})+n\cdot U_T\cdot C \qquad (1)$$

Here, n is a weak inversion slope factor, $U_T$ is a thermal voltage, and C is a constant based on the design values of the circuit structure and each MOS transistor.

Since the current consumption of the reference voltage circuit 10 is determined by the drain current of the MOS transistor 11 operating in the weak inversion region, it is possible to make the current consumption minute. As a result, since there is no need to increase the L length of the MOS transistor or provide a constant current circuit for generating a minute constant current in order to reduce the current consumption, the circuit scale can be reduced.

As can be seen from Equation 1, the first term on the right side indicates that the temperature dependences of the threshold voltage $V_{TE}$ and the threshold voltage $V_{TD}$ cancel out. The temperature dependence of the output voltage $V_{out}$ can be reduced by setting the contribution of the second term on the right side smaller than the first term, or by adjusting the temperature dependence of the second term on the right side to cancel out the temperature dependence remaining in the first term.

As described above, according to the reference voltage circuit of the embodiment, since the current consumption is determined by the current of the enhancement type MOS transistor in the weak inversion operation, the current consumption can be made minute with a small circuit scale.

Although the reference voltage circuit according to the embodiment is constructed from two pairs of MOS transistors, the first MOS transistor pair may be composed of plural pairs of MOS transistors when a higher reference voltage is needed.

Figure 2:
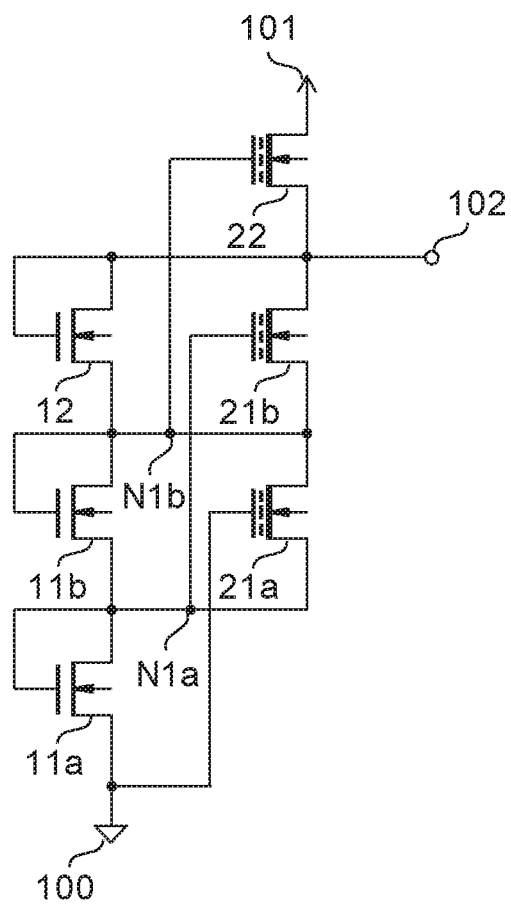
FIG. 2 is a circuit diagram for describing a first modified example of the reference voltage circuit according to the embodiment.

FIG. 2 illustrates the first modified example of the reference voltage circuit according to the embodiment. For example, the reference voltage circuit 10a may be constructed from the first MOS transistor pair which is composed of an MOS transistor pair of MOS transistors 11a, 21a and an MOS transistor pair of MOS transistors 11b, 21b. Here, a node between the drain of the MOS transistor 11a and the source of the MOS transistor 21a is denoted by N1a, and a node between the drain of the MOS transistor 11b and the source of the MOS transistor 21b is denoted by N1b.

The operation of the reference voltage circuit 10a having the above-mentioned structure will be described below.

The MOS transistors 11a, 11b and the MOS transistors 21a, 21b operate in the same manner as in the reference voltage circuit 10 of FIG. 1, and the voltage at the node N1b is expressed by Equation 1.

The same operational relationship holds between the MOS transistor 12 and the MOS transistor 22, and the voltage at the output terminal 102 as a node between the drain of the MOS transistor 12 and the source of the MOS transistor 22 stabilizes at a constant voltage in respect to the node N1b.

Similarly, the MOS transistor 12 and the MOS transistor 22 operate in the weak inversion region, and the output voltage $V_{out}$ at the output terminal 102 stabilizes at a voltage in Equation 2.

$$V_{out}=3/2(V_{TE}-V_{TD})+n\cdot U_T\cdot C \qquad (2)$$

Then, the same is repeated in the above description of the operation when the number of MOS transistor pairs is increased to M pairs. In other words, the number M of pairs of MOS transistors can be adjusted to obtain arbitrarily high voltage proportional to one-half of the voltage as the sum of threshold voltages of enhancement type MOS transistors and depletion type MOS transistors. Further, since the current consumption of the reference voltage circuit 10, 10a is determined by the drain current of the MOS transistor 11, 11a respectively operating in the weak inversion region, the current consumption can be made minute.

Figure 3:
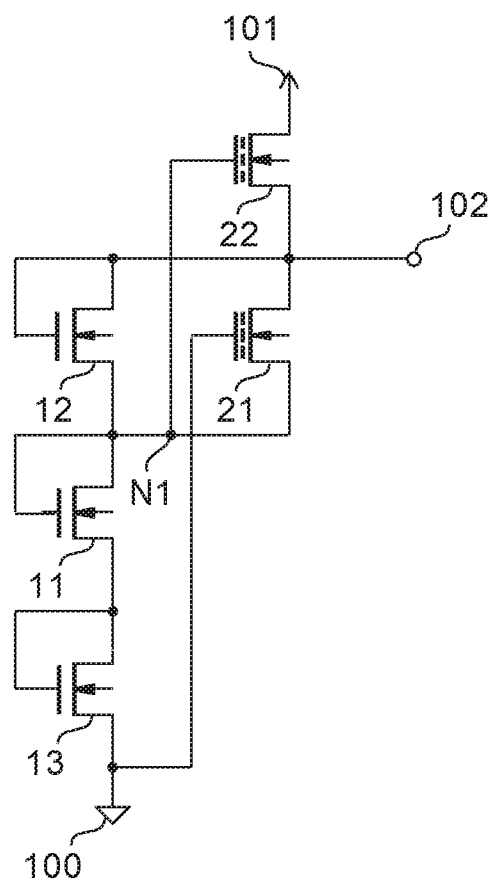
FIG. 3 is a circuit diagram for describing a second modified example of the reference voltage circuit according to the embodiment.

FIG. 3 is a circuit diagram for describing the second modified example of the reference voltage circuit according to the embodiment.

A reference voltage circuit 10b is constructed to have a first-conductivity enhancement type MOS transistor 13 inserted between the MOS transistor 11 and the ground terminal 100 in addition to the structure of the reference voltage circuit 10 in FIG. 1. In the circuit diagram of FIG. 3, the same components as those in FIG. 1 are given the same reference numerals to omit the redundant description thereof.

In the MOS transistor 13 the source is connected to the ground terminal 100, and the gate and the drain are connected to the source of the MOS transistor 11. The gate of the MOS transistor 21 is connected to the source of the MOS transistor 13 and the ground terminal 100.

The operation of the reference voltage circuit 10a having the above-mentioned structure will be described below.

Since in the reference voltage circuit 10b the MOS transistor 11 and the MOS transistor 13 are connected in series, each gate-source voltage is small in a stable condition. In other words, the MOS transistor 11 and the MOS transistor 13 have an operating point in the weak inversion region even at a high temperature.

Since the threshold voltage of an MOS transistor generally becomes low at high temperature, the MOS transistor tends to shift from the weak inversion operation to the strong inversion operation. In contrast, since the reference voltage circuit 10b has the structure described above, the MOS transistor 11 and the MOS transistor 13 keep the operational points in the weak inversion region even at a high temperature, and hence the current consumption can continue to be small.

As described above, according to the reference voltage circuit 10b, the current consumption can be made minute over a wide temperature range in addition to the effect brought from the reference voltage circuit 10.

Figure 4:
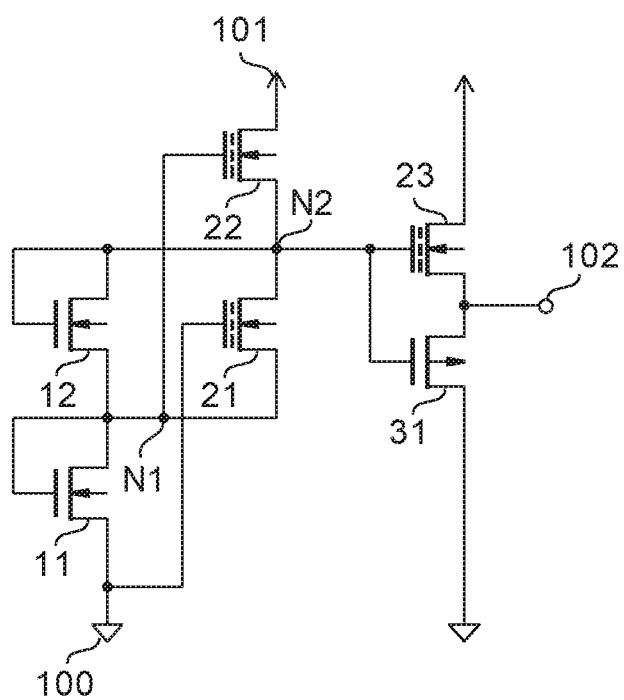
FIG. 4 is a circuit diagram for describing a third modified example of the reference voltage circuit according to the embodiment.

FIG. 4 is a circuit diagram for describing the third modified example of the reference voltage circuit according to the embodiment.

In addition to the reference voltage circuit 10, a reference voltage circuit 20 further includes a first-conductivity depletion type MOS transistor 23 and a second-conductivity (P-channel here) enhancement type MOS transistor 31. The MOS transistor 23 and the MOS transistor 31 constitute an output circuit of the reference voltage circuit 20. In the circuit diagram of FIG. 4, the same components as those in FIG. 1 are given the same reference numerals to omit the redundant description thereof.

In the MOS transistor 23 the drain is connected to the power supply terminal 101, the gate is connected to a node N2, and the source is connected to the output terminal 102. In the MOS transistor 31 the source is connected to the output terminal 102, the gate is connected to the node N2, and the drain is connected to the ground terminal 100.

The operation of the reference voltage circuit 20 having the above-mentioned structure will be described below.

The MOS transistors 11, 12 and the MOS transistors 21, 22 operate in the same manner as in the reference voltage circuit 10, and the voltage at the node N2 between the drain of the MOS transistor 12 and the source of the MOS transistor 22 is expressed by Equation 1.

Here, the absolute value of a threshold voltage $V_{TE2}$ of the MOS transistor 31 is set larger than the absolute value of a threshold voltage $V_{TD}$ of the MOS transistor 23. At this time, the MOS transistor 31 and the MOS transistor 23 operate in the weak inversion region, and the output voltage $V_{out}$ at the output terminal 102 stabilizes at a voltage in Equation 3.

$$V_{out}=(V_{TE}-V_{TD})+n \cdot U_T \cdot C+1/2(-V_{TE2}-V_{TD}) \quad (3)$$

Since the MOS transistor 31 operates in the weak inversion region, the current in a path between the power supply terminal 101 and the ground terminal 100 through the MOS transistor 31 is made minute. This makes the increase in current consumption very small due to the addition of the MOS transistor 31 and the MOS transistor 23.

Further, the temperature dependences of the threshold voltage $V_{TE2}$ and the threshold voltage $V_{TD}$ of the third term on the right side of Equation 3 cancel out. This makes the temperature dependence of the output voltage $V_{out}$ of the reference voltage circuit 20 small.

In the reference voltage circuit 20 constructed as described above, since the output impedance is determined by the design values of the MOS transistor 31 and the MOS transistor 23, it is not affected by the number of pairs of enhancement type MOS transistors and depletion type MOS transistors. According to the reference voltage circuit 20, the output impedance can be made low when the number of pairs of enhancement type MOS transistors and depletion type MOS transistors increases.

Figure 5:
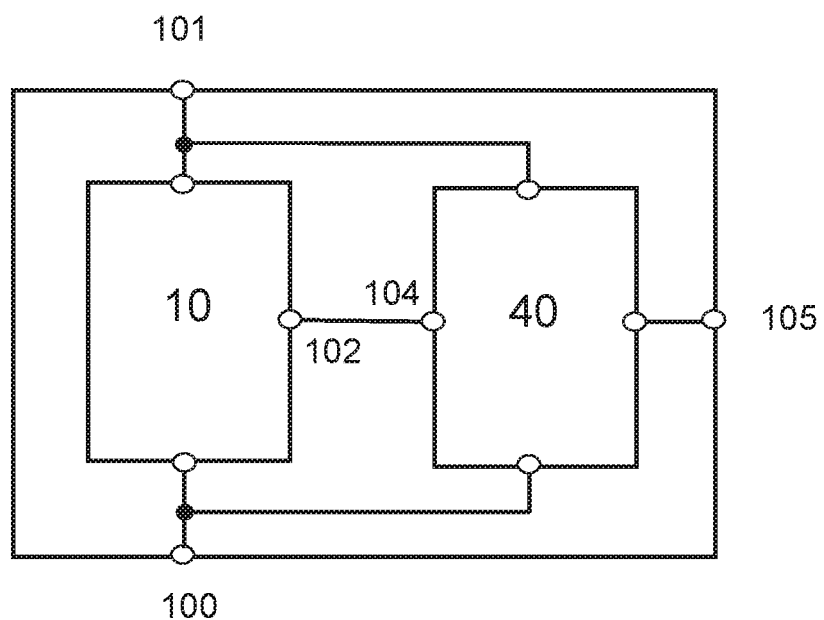
FIG. 5 is a circuit diagram for describing a semiconductor device having a reference voltage circuit according to the embodiment.

FIG. 5 is a circuit diagram for describing a semiconductor device having a reference voltage circuit according to the embodiment. The semiconductor device 50 includes the reference voltage circuit 10 according to the embodiment and a main circuit 40. The main circuit 40 receives the reference voltage which is the output voltage provided from the terminal 102 of the reference voltage circuit 10 to an input terminal 104 of the main circuit 40. The main circuit is connected between the power supply terminal 101 and the ground terminal 100, and provides a signal from an signal output terminal 105.

In the above-mentioned description the reference voltage circuit is not limited to the reference voltage circuit 10 of the embodiment. Any reference voltage circuit described in the first to the third modified example of the reference voltage circuit (10a, 10b, 20) according to the embodiment can also be used in the semiconductor device 50 instead of the reference voltage circuit 10.

The embodiment of the present invention is described above though, the present invention is not limited to the aforementioned embodiment, and it is needless to say that various changes can be made without departing from the gist of the present invention.

For example, two or more enhancement type MOS transistors 13 may be provided in the reference voltage circuit 10b.

What is claimed is:

1. A reference voltage circuit, comprising
a first MOS transistor pair;
a second MOS transistor pair; and
an output terminal,
the first MOS transistor pair comprising a first MOS transistor of a first-conductivity enhancement type having a gate and a drain connected to each other; and a second MOS transistor of a first-conductivity depletion type having a gate connected to a source of the first MOS transistor, a source connected to the drain of the first MOS transistor, and a drain connected to the output terminal, and
the second MOS transistor pair comprising a third MOS transistor of the first-conductivity enhancement type having a gate and a drain connected to the output terminal and a source connected to the source of the second MOS transistor; and a fourth MOS transistor of the first-conductivity depletion type having a gate connected to the source of the third MOS transistor and a source connected to the output terminal,
wherein all of the first MOS transistor to the fourth MOS transistor are configured to operate in a weak inversion region.

2. The reference voltage circuit according to claim 1, wherein the first MOS transistor pair further comprises additional first-conductivity enhancement type and first-conductivity depletion type MOS transistor pairs.

3. The reference voltage circuit according to claim 1, further comprising a fifth MOS transistor of the first-conductivity enhancement type having a gate and a drain connected to the source of the first MOS transistor, and a source connected to the gate of the second MOS transistor, the fifth MOS transistor being configured to operate in the weak inversion region.

4. The reference voltage circuit according to claim 1, further comprising an output circuit inserted between the source of the fourth MOS transistor and the output terminal, the output circuit having a sixth MOS transistor of the first-conductivity depletion type and a seventh MOS transistor of a second-conductivity enhancement type both of which operate in the weak inversion region.

5. The reference voltage circuit according to claim 2, further comprising an output circuit inserted between the source of the fourth MOS transistor and the output terminal, the output circuit having a sixth MOS transistor of the first-conductivity depletion type and a seventh MOS transistor of a second-conductivity enhancement type both of which operate in the weak inversion region.

6. The reference voltage circuit according to claim 3, further comprising an output circuit inserted between the source of the fourth MOS transistor and the output terminal, the output circuit having a sixth MOS transistor of the first-conductivity depletion type and a seventh MOS transistor of a second-conductivity enhancement type both of which operate in the weak inversion region.

7. A semiconductor device comprising the reference voltage circuit according to claim 1.

8. A semiconductor device comprising the reference voltage circuit according to claim 2.

9. A semiconductor device comprising the reference voltage circuit according to claim 3.

10. A semiconductor device comprising the reference voltage circuit according to claim 4.

* * * * *